United States Patent
Li et al.

(10) Patent No.: US 6,887,799 B1
(45) Date of Patent: May 3, 2005

(54) INDIUM OXIDE CONDUCTIVE FILM

(75) Inventors: Tingkai Li, Vancouver, WA (US); Sheng Teng Hsu, Camas, WA (US)

(73) Assignee: Sharp Laboratories of America, Inc., Camas, WA (US)

( * ) Notice: Subject to any disclaimer, the term of this patent is extended or adjusted under 35 U.S.C. 154(b) by 0 days.

(21) Appl. No.: 10/741,803

(22) Filed: Dec. 18, 2003

(51) Int. Cl.⁷ .............................................. H01L 21/31
(52) U.S. Cl. ...................................................... 438/778
(58) Field of Search ................................ 438/197, 758, 438/778

(56) References Cited

FOREIGN PATENT DOCUMENTS

JP          55104013      *  8/1980

* cited by examiner

Primary Examiner—Robert Pascal
Assistant Examiner—Scott B. Geyer
(74) Attorney, Agent, or Firm—David C. Ripma; Matthew D. Rabdau; Joseph P. Curtin

(57) ABSTRACT

One-transistor ferroelectric memory devices using an indium oxide film ($In_2O_3$), an $In_2O_3$ film structure, and corresponding fabrication methods have been provided. The method for controlling resistivity in an $In_2O_3$ film comprises: depositing an In film using a PVD process, typically with a power in the range of 200 to 300 watts; forming a film including In overlying a substrate material; simultaneously (with the formation of the In-including film) heating the substrate material, typically the substrate is heated to a temperature in the range of 20 to 200 degrees C.; following the formation of the In-including film, post-annealing, typically in an O2 atmosphere; and, in response to the post-annealing: forming an $In_2O_3$ film; and, controlling the resistivity in the $In_2O_3$ film. For example, the resistivity can be controlled in the range of 260 to 800 ohm-cm.

24 Claims, 8 Drawing Sheets

INDIUM OXIDE CONDUCTIVE FILM

BACKGROUND OF THE INVENTION

1. Field of the Invention

This invention generally relates to integrated circuit (IC) fabrication and, more particularly, to an indium oxide ($In_2O_3$) film with a controlled resistivity for use in ferroelectric memory devices, and a method for fabricating the same.

2. Description of the Related Art

One-transistor (1T) ferroelectric memory devices are conventionally made with MFMOS (Metal, Ferroelectrics, Metal, Oxide and Silicon) or MFOS (Metal, Ferroelectrics, Oxide, and Silicon). The retention properties of 1T ferroelectric memories present a considerable technical challenge, due to the generation of a depolarization field once the device has been programmed. Three possible mechanisms may be responsible for the poor retention of 1T ferroelectric memories, namely: leakage current; trapped charge within the ferroelectric film; and, the depolarization field. Because the leakage current increases with increasing the temperature, the leakage current may seriously affect the retention properties at high temperatures. Trapped charges in the ferroelectric film are due to the high density of internal defects. Trapped charges, working together with leakage current, may also affect the retention property. The retention time (t) for a 1T device that has a remnant polarization (Pr), leakage current (I) and a trapping density (d) may be estimated to be t=Pr/Id. The formula shows that higher leakage current and trapping density result in poor retention properties.

On the other hand, for 1T MFMOS memory devices, the floating gate may be neutralized because of the leakage current, and the remnant polarization of ferroelectric materials cannot be applied to the channel. In this case, the memory function of 1T MFMOS devices will be lost. The depolarization field applied to the ferroelectric dielectric after programming is due to the existence of an oxide capacitor in series with the ferroelectric capacitor in both MFMOS and MFOS memory cells. The linear capacitor tends to discharge all stored charge and, therefore, generate a voltage opposed to the ferroelectric polarization, which can be expressed as $Q_R/(C_{FE}+C_{OX})$, where $Q_R$ is the remnant charge, $C_{FE}$ and $C_{OX}$, are the capacitances of the ferroelectric and oxide capacitors, respectively. The depolarization field, opposes the ferroelectric film polarization, and decreases the initial applied polarization so that, in time, the polarization reaches a steady state. The result is a 1T FE memory device with poor memory-retention properties, especially at higher temperatures. That is, the memory state of the device is retained for a relatively short life, on the order of one month.

It would be advantageous if a thin film could be developed with a controlled resistivity, for the replacement of a gate insulator material in a 1T FE memory device.

SUMMARY OF THE INVENTION

In order to overcome the above-mentioned problems the present invention introduces a metal/ferroelectric/metal/on semiconductive metal oxide on silicon structure, as well as a metal/ferroelectric gate stack on semiconductive metal oxide on silicon substrate structure. These two device structures do no have an insulator oxide capacitor in series with the ferroelectric capacitor and floating gate. Therefore, the memory retention time associated with these devices is much longer than the prior art structures.

The present invention solves the above-mentioned problems by using a Metal/FE/$In_2O_3$/Si or Metal/FE/Metal/$In_2O_3$/Si one-transistor ferroelectric memory device. The memory retention properties of MFMox devices are improved in response to controlling the electrical properties, such as resistivity, of $In_2O_3$ thin film, as formed on Si or a metal. More specifically, the present invention describes the control of the electrical properties of $In_2O_3$ thin films, as deposited on Pt, Si and $SiO_2$, using physical vapor deposition (PVD) and post-annealing processes. Also described is the use of the controlled $In_2O_3$ films in MFMox FeRAM applications.

Accordingly, a method is provided for controlling resistivity in an $In_2O_3$ film. The method comprises: depositing an In film using a PVD process, typically with a power in the range of 200 to 300 watts; forming a film including In overlying a substrate material; simultaneously (with the formation of the In-including film) heating the substrate material, typically the substrate is heated to a temperature in the range of 20 to 200 degrees C.; following the formation of the In-including film, post-annealing, typically in an $O_2$ atmosphere; in response to the post-annealing: forming an $In_2O_3$ film; and, controlling the resistivity in the $In_2O_3$ film. For example, the resistivity can be controlled in the range of 260 to 800 ohm-cm.

In one aspect of the method the In film is formed in a 0% oxygen partial pressure environment, with a thickness in the range of 5 to 50 nanometers (nm). Then, post-annealing in an $O_2$ atmosphere includes annealing at a temperature in the range between 500 and 800 degrees C., for a time duration in the range between 5 to 60 minutes.

Alternately, an InOx film is formed in an oxygen partial pressure environment in the range between 0.01 and 60%, with a thickness in the range of 10 to 100 nm. Then, post-annealing in an $O_2$ atmosphere includes annealing at a temperature in the range of 400 to 800 degrees C., for a time duration in the range between 5 and 60 minutes.

Possible substrate materials include platinum (Pt), iridium (Ir), other noble metals, silicon (Si), high-k oxides, and silicon dioxide ($SiO_2$).

Additional details of the above-described method, a method for forming a one-transistor (1T) memory device using an $In_2O_3$ film as a gate insulator replacement material, and an $In_2O_3$ film structure are provided below.

DETAILED DESCRIPTION OF THE PREFERRED EMBODIMENTS

Figure 1:
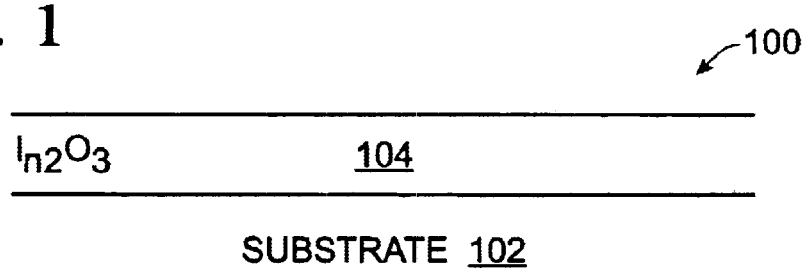
FIG. 1 is a partial cross-sectional view of the present invention indium oxide ($In_2O_3$) film structure.

FIG. 1 is a partial cross-sectional view of the present invention indium oxide ($In_2O_3$) film structure. The film structure 100 comprises a substrate 102 and an $In_2O_3$ film 104 overlying the substrate 102, having a resistivity in the range of 260 to 800 ohm-cm. The substrate 102 can be a material such as platinum (Pt), iridium (Ir), other noble metals, silicon (Si), high-k oxides, or silicon dioxide ($SiO_2$).

Figure 2:
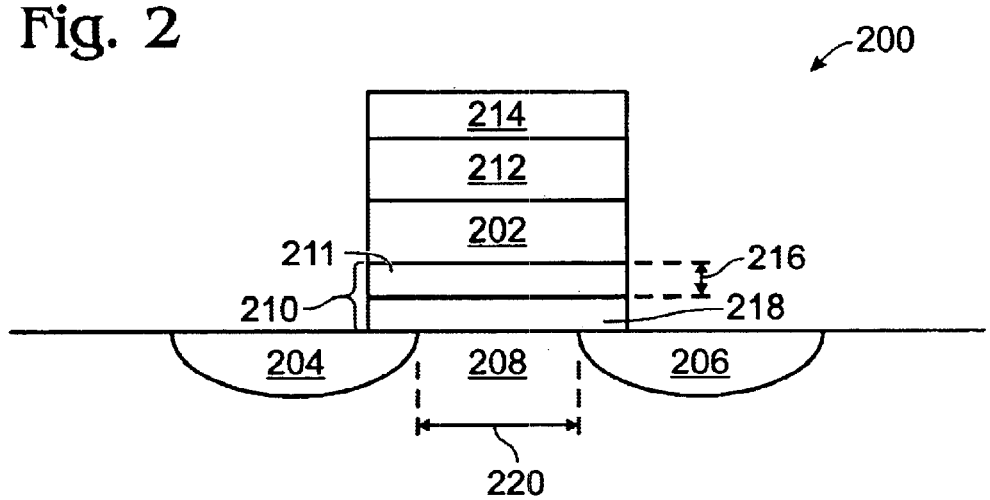
FIG. 2 is a partial cross-sectional view of the present invention 1T memory device using an $In_2O_3$ film as a gate insulator.

FIG. 2 is a partial cross-sectional view of the present invention 1T memory device using an $In_2O_3$ film as a gate insulator. The device 200 comprises a CMOS transistor gate 202, source 204, drain 206, and channel region 208. A gate insulator 210 is formed from an $In_2O_3$ thin film 211, interposed between the channel region 208 and the gate 202. The $In_2O_3$ film 211 has a resistivity in the range of 260 to 800 ohm-cm. A memory cell film 212 overlies the gate electrode 202. A top electrode 214 overlies the memory cell film 212.

The $In_2O_3$ thin film 211 includes crystals having a grain size in the range of 3 to 30 nanometers (nm). The $In_2O_3$ thin film 211 has a thickness 216 in the range 5 to 100 nm.

A material 218 can be interposed between the channel 208 and the $In_2O_3$ film 211. The material 218 can be Pt, Ir, other noble metals, Si, high-k oxides, or $SiO_2$.

When the device 200 has a gate channel length 220 of 0.1 micron, then the $In_2O_3$ film gate insulator 211 has a resistivity of 700 ohm-cm. When the gate channel length 220 is 100 microns, the $In_2O_3$ film gate insulator 211 has a resistivity of 300 ohm-cm. When gate channel length 220 is in the range of 1 to 10 microns, the $In_2O_3$ film gate insulator 211 has a resistivity in the range of 400 to 300 ohm-cm. A lower resistivity is associated with longer channel lengths.

Figure 4:
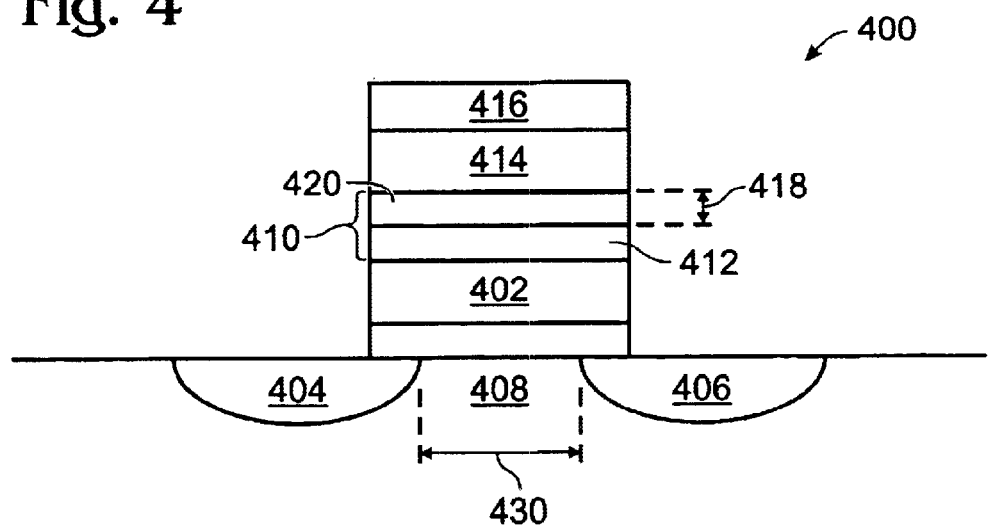
FIG. 4 is a partial cross-sectional view of another aspect of a 1T memory device using an $In_2O_3$ film as an insulator.

FIG. 4 is a partial cross-sectional view of another aspect of a 1T memory device using an $In_2O_3$ film as an insulator. The device 400 includes a CMOS transistor gate 402, source 404, drain 406, and channel region 408. An insulator 410 is formed from an $In_2O_3$ thin film 412 overlying the gate 402. The $In_2O_3$ film 412 has a resistivity in the range of 260 to 800 ohm-cm. A memory cell film 414 overlies the $In_2O_3$ thin film 412. A top electrode 416 overlies the memory cell film 414.

As above, the $In_2O_3$ thin film 412 includes crystals having a grain size in the range of 3 to 30 nm, and has a thickness 418 in the range 5 to 100 nm. A material 420 may be interposed between the memory cell film 414 and the $In_2O_3$ film 412, such as Pt, Ir, other noble metals, Si, high-k oxides, or $SiO_2$.

As above, when the gate 402 has a gate channel length 430 of 0.1 micron, the $In_2O_3$ film 412 has a resistivity of 700 ohm-cm. When the gate channel length 430 is 100 microns, the $In_2O_3$ film 412 has a resistivity of 300 ohm-cm. When the gate channel length 420 is in the range of 1 to 10 microns, the $In_2O_3$ film 412 has a resistivity in the range of 400 to 300 ohm-cm.

Functional Description

Experimentally, $In_2O_3$ thin films were deposited on Pt, Si and $SiO_2$, DC sputtering an In target at various oxygen partial pressures, sputtering power levels, and substrate temperatures. The phase, grain size, and the resistance of the $In_2O_3$ thin films are responsive to PVD and post-annealing process conditions.

In a first experiment, P type Si (100), $SiO_2$/Si wafers, and Pt/Ti/$SiO_2$/Si were used as substrates for $In_2O_3$ thin film depositions. For $In_2O_3$ deposited on Si, the Si wafers were dipped in HF (50:1) for 5 seconds before $In_2O_3$ depositions. For $In_2O_3$ deposited on $SiO_2$, the Si wafers were CVD deposited $SiO_2$ with a thickness of about 200 nm. The In target DC sputtering conditions were as follows.

DC sputtering power: 200–300 W
Oxygen partial pressures: 0–60%
Substrate temperatures: 20–200° C.
Post-annealing temperatures: 400–850° C.

Figure 5:
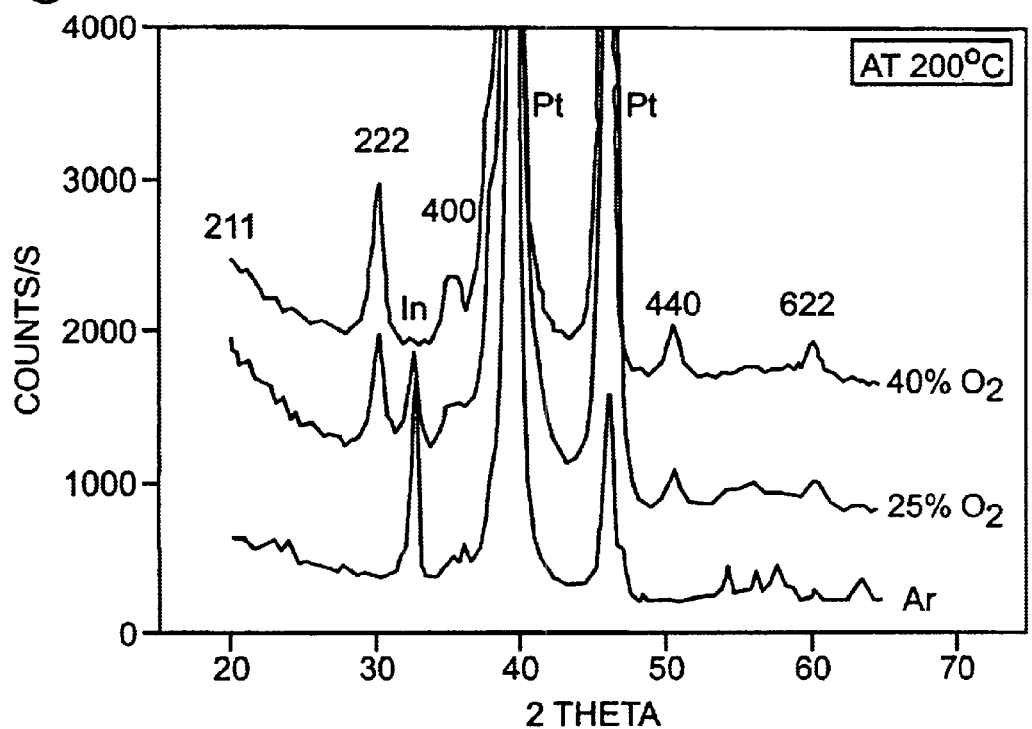
FIG. 5 is a figure showing the X-ray patterns of $In_2O_3$ thin films deposited on Pt, with various oxygen partial pressures, at a substrate temperature of 200° C.

FIG. 5 is a figure showing the X-ray patterns of $In_2O_3$ thin films deposited on Pt, with various oxygen partial pressures, at a substrate temperature of 200° C. With increasing oxygen partial pressure, the In thin film transforms to indium oxide.

Figure 6:
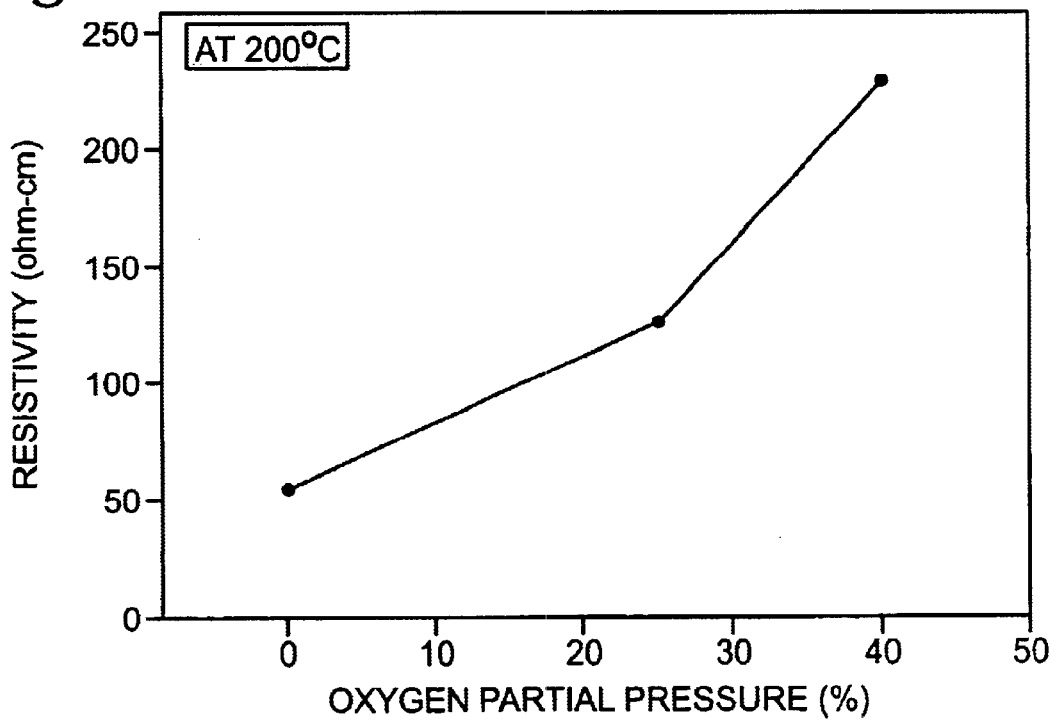
FIG. 6 is a figure showing the relationship between resistivity and oxygen partial pressure.

FIG. 6 is a figure showing the relationship between resistivity and oxygen partial pressure. The resistivity of $In_2O_3$ thin films deposited on Pt increases, with increasing oxygen partial pressure.

Figure 7:
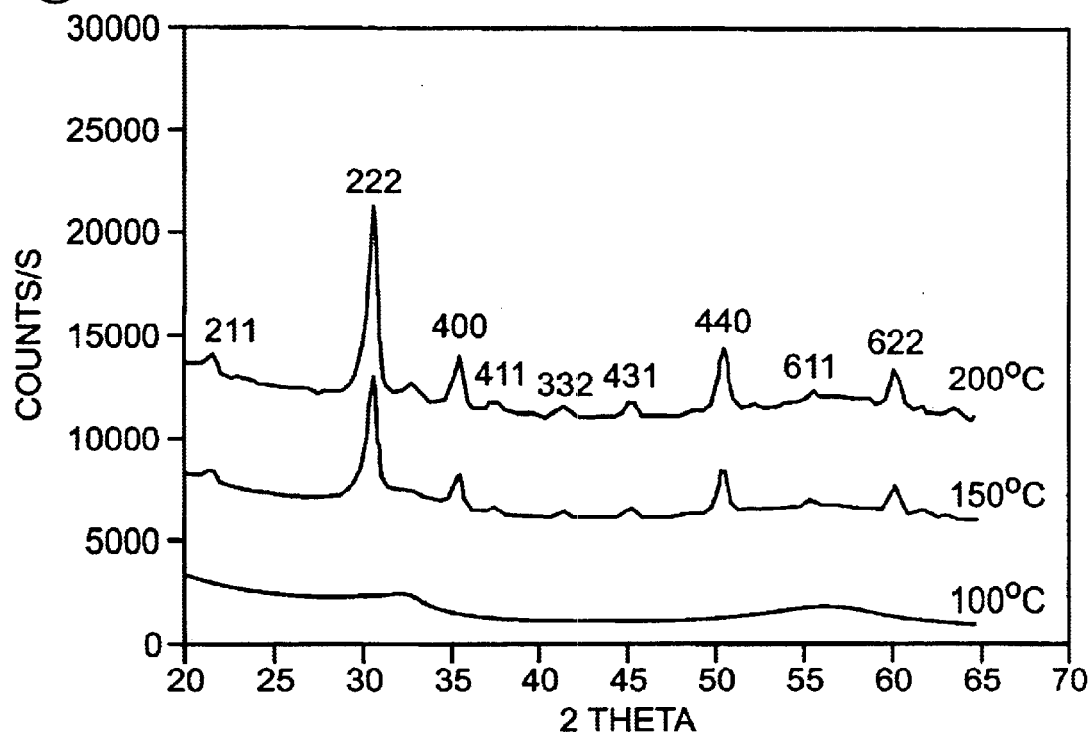
FIG. 7 is a figure shows the X-ray patterns of $In_2O_3$ thin films deposited on Si at various substrate temperatures.

FIG. 7 is a figure shows the X-ray patterns of $In_2O_3$ thin films deposited on Si at various substrate temperatures. With increasing substrate temperatures, the $In_2O_3$ thin films changes from a nanocrystal structure, to polycrystalline thin films. $In_2O_3$ thin films deposited on Si and $SiO_2$ exhibit similar behavior.

Figure 8:
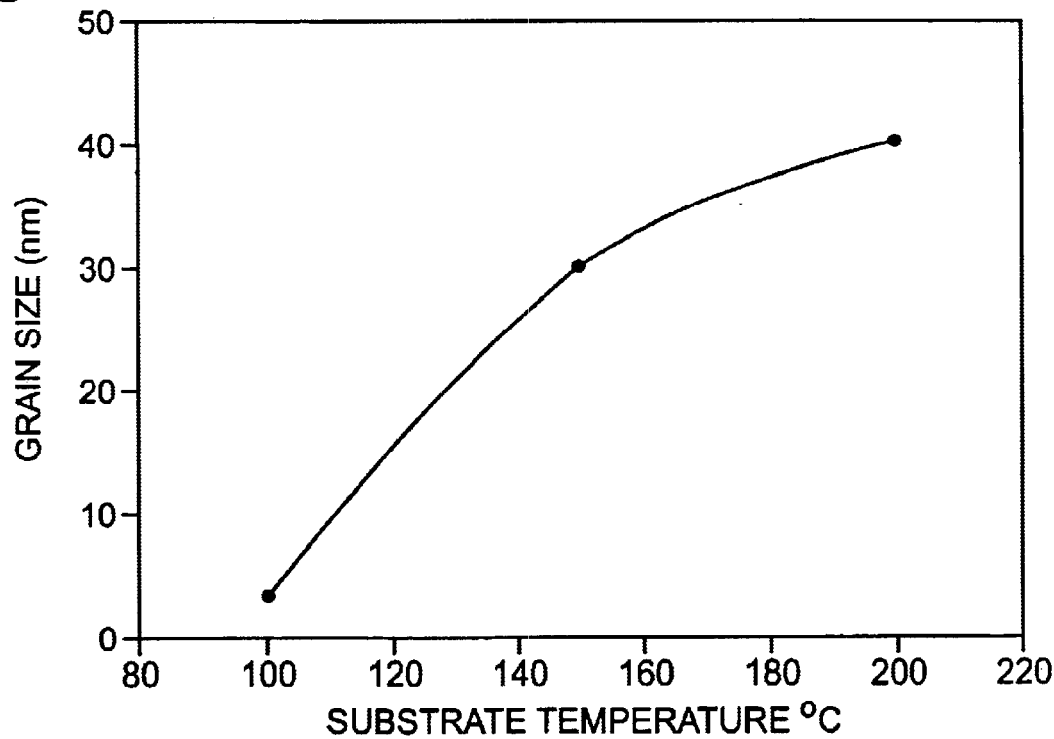
FIG. 8 is a figure showing the relationship between grain size and substrate temperature.

FIG. 8 is a figure showing the relationship between grain size and substrate temperature. The grain size increases from 3 nm to 30 nm, by increasing substrate temperature from 100° C. to 200° C.

Figure 9:
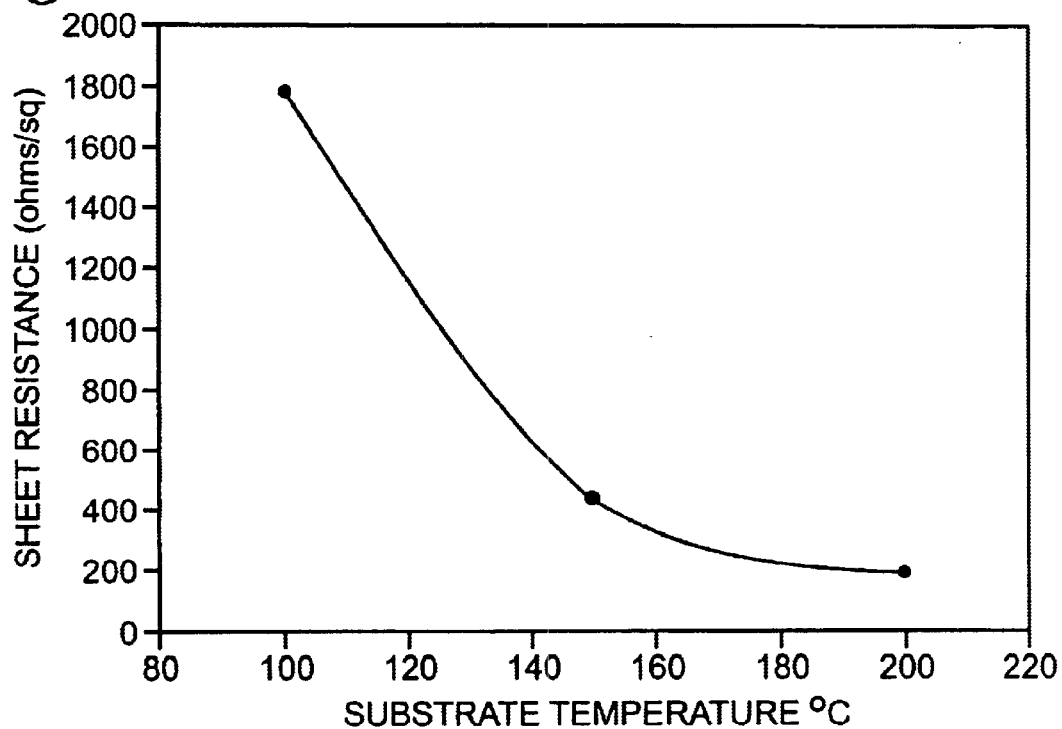
FIG. 9 is a figure showing the relationship between sheet resistance and substrate temperature.

FIG. 9 is a figure showing the relationship between sheet resistance and substrate temperature. The sheet resistance of $In_2O_3$ thin films decreases, with an increase in substrate temperature.

Figure 10:
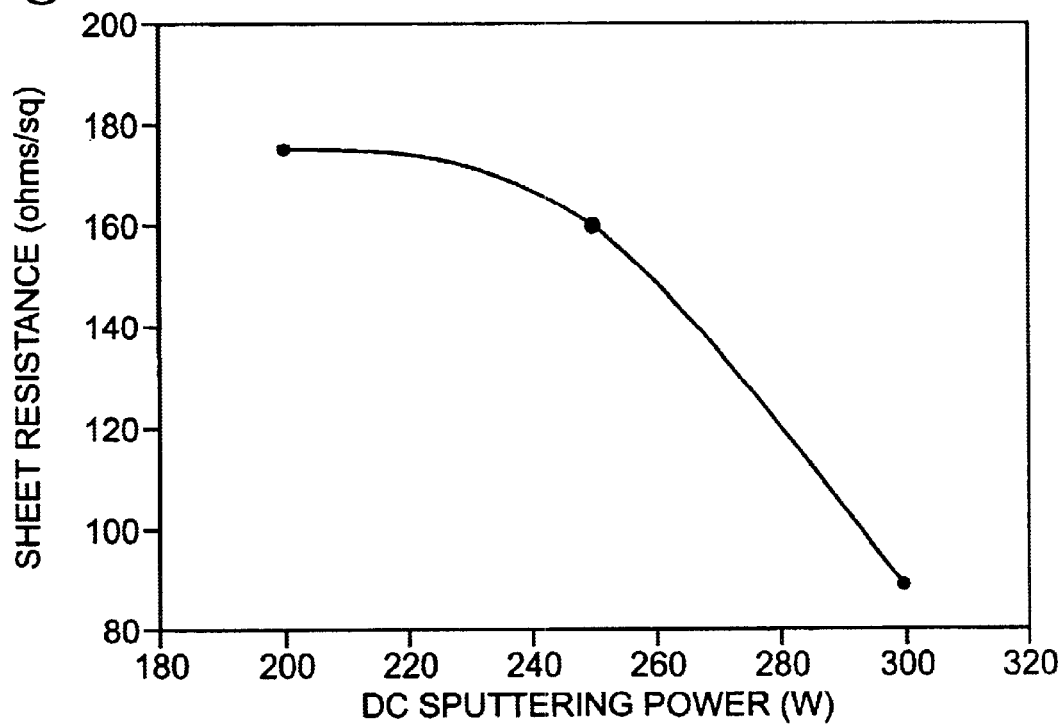
FIG. 10 is a figure showing the relationship between phase and sputtering power.

FIG. 10 is a figure showing the relationship between phase and sputtering power. There is no significant change of phase formation of $In_2O_3$ thin films deposited on Si substrate at various sputtering powers. The deposition rate increases a little, and sheet resistances decrease with an increase in DC sputtering power.

Figure 11:
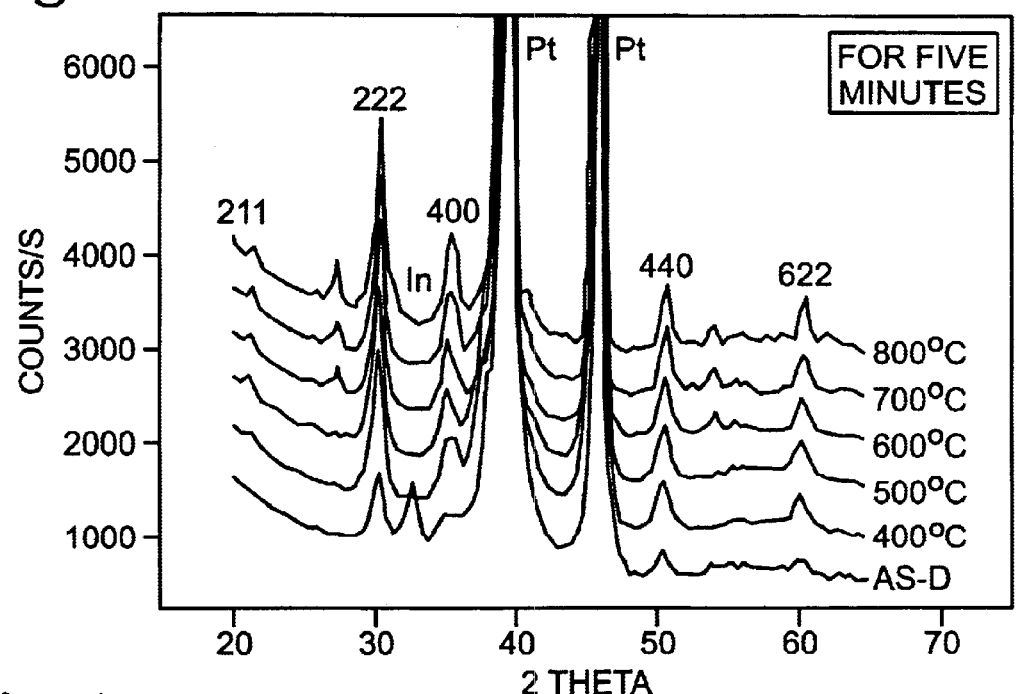
FIG. 11 is a figure showing the effects of post-annealing.

FIG. 11 is a figure showing the effects of post-annealing. The effects of post-annealing on the phase formation of $InO_x$ thin films, deposited on Pt, are shown. As-deposited $InO_x$ phase thin films have an oxygen deficiency. After annealing at 400° C. for 5 minutes, in an oxygen atmosphere, the $InO_x$ thin film is mostly transformed into an $In_2O_3$ thin film. The $In_2O_3$ peaks increase with an increase in annealing temperatures, meaning that the grain size of $In_2O_3$ thin film increases with increasing temperatures.

Figure 12:
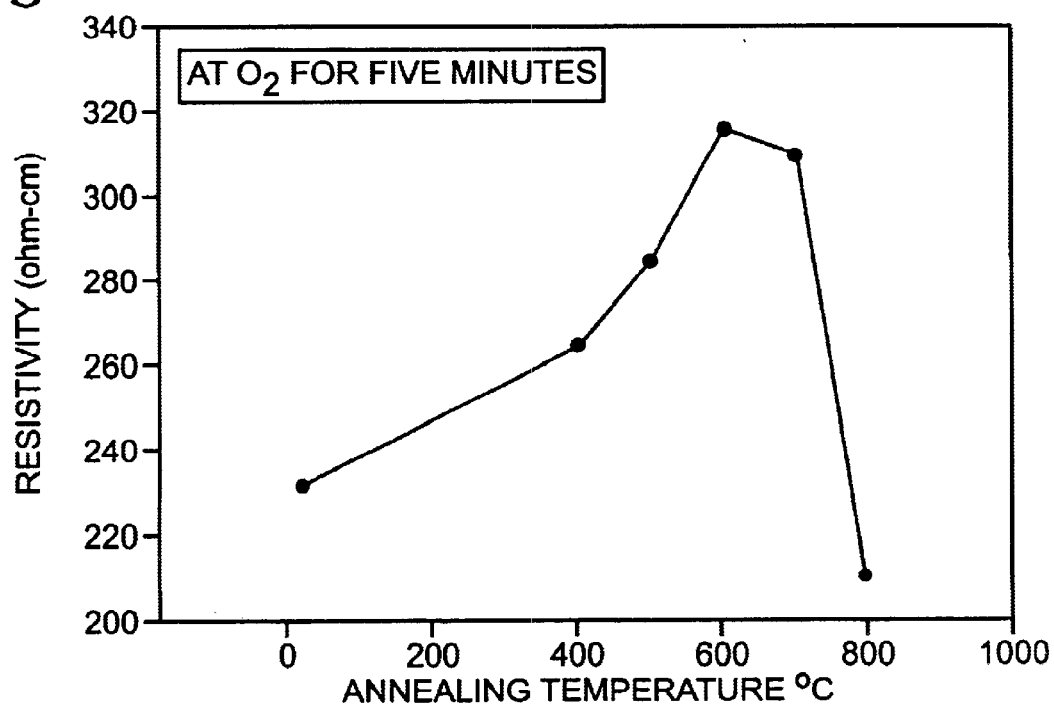
FIG. 12 is a figure showing the effects of post-annealing on the resistivity of $InO_x$ thin films, as deposited on Pt.

FIG. 12 is a figure showing the effects of post-annealing on the resistivity of $InO_x$ thin films, as deposited on Pt. The resistivity increases with increasing temperature due to the In oxidation. After reaching a maximum value at around 600 degrees C., the resistivity decreases with increasing temperature due to a growth in the grain size.

Figure 13:
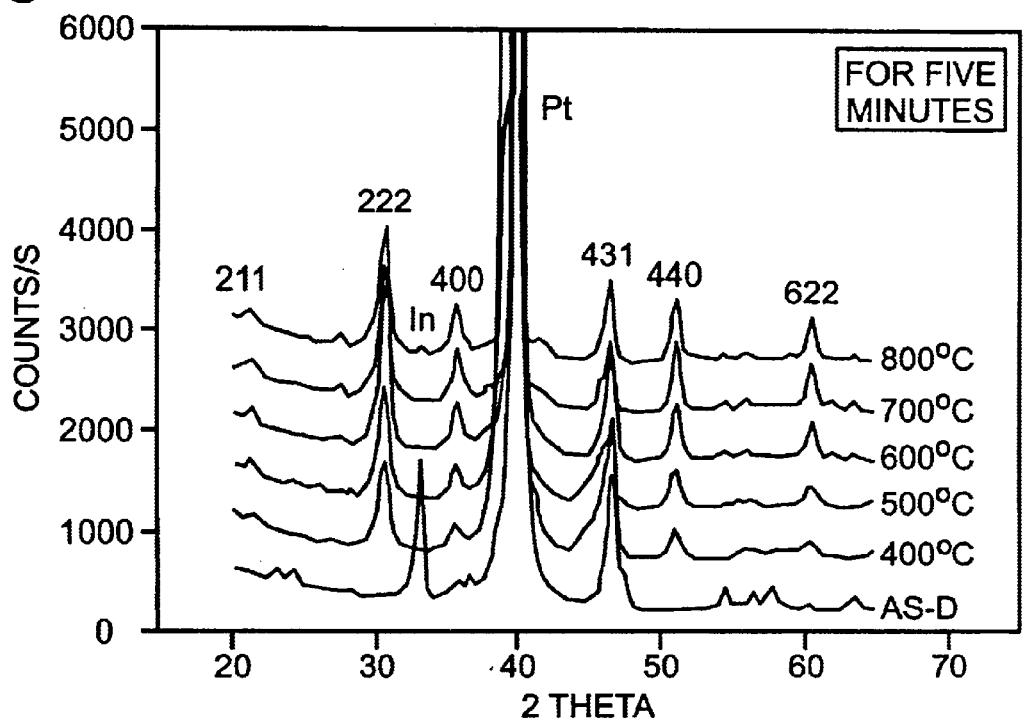
FIG. 13 is a figure showing the effects of post-annealing on the phase formation In thin films deposited on Pt.

FIG. 13 is a figure showing the effects of post-annealing on the phase formation In thin films deposited on Pt. These films were deposited in a 0% partial pressure. The as-deposited In phase thin film is annealed at 400° C. for 5 minutes, in an oxygen atmosphere. The In thin film is initially transformed into $InO_x$ thin film with oxygen deficiencies. $In_2O_3$ peaks increase, and the In peaks decrease and disappear at higher annealing temperatures. Thus, full oxidation occurs along with an increase in $In_2O_3$ thin film grain size, in response to increased temperatures.

Figure 14:
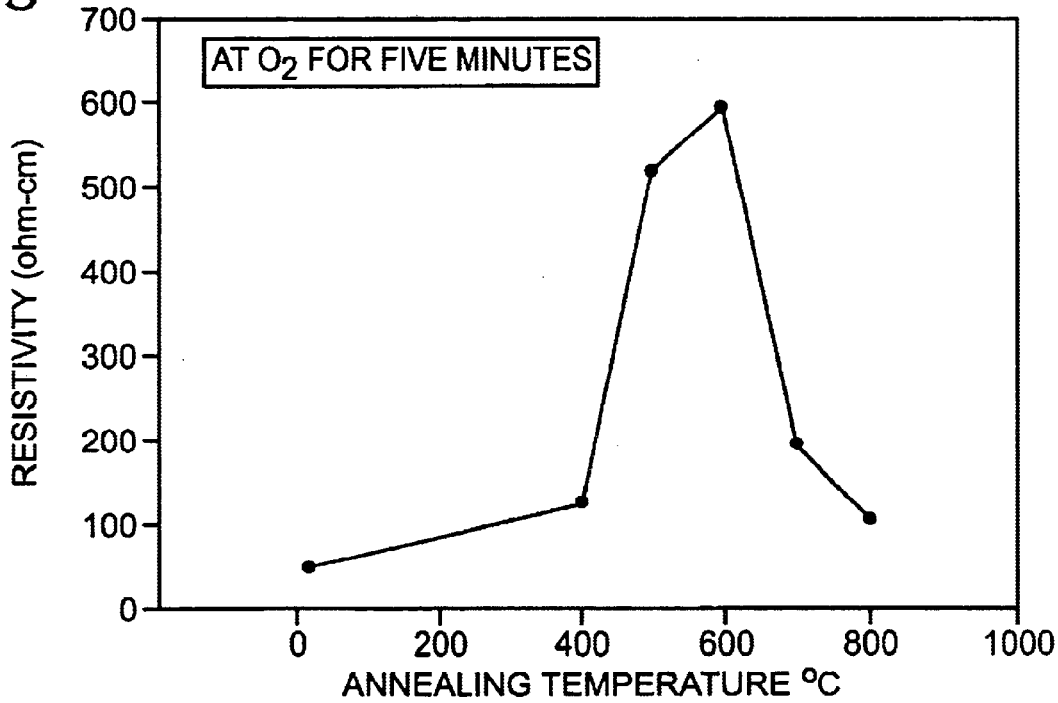
FIG. 14 is a figure showing the effects of post-annealing on the resistivity of In thin films deposited on Pt.

FIG. 14 is a figure showing the effects of post-annealing on the resistivity of In thin films deposited on Pt. The resistivity increases with increasing temperature due to the In oxidation. After reaching a maximum value at around 600 degrees C., the resistivity decreases as temperature is increased, in response to an increase in crystal grain size.

Figure 15:
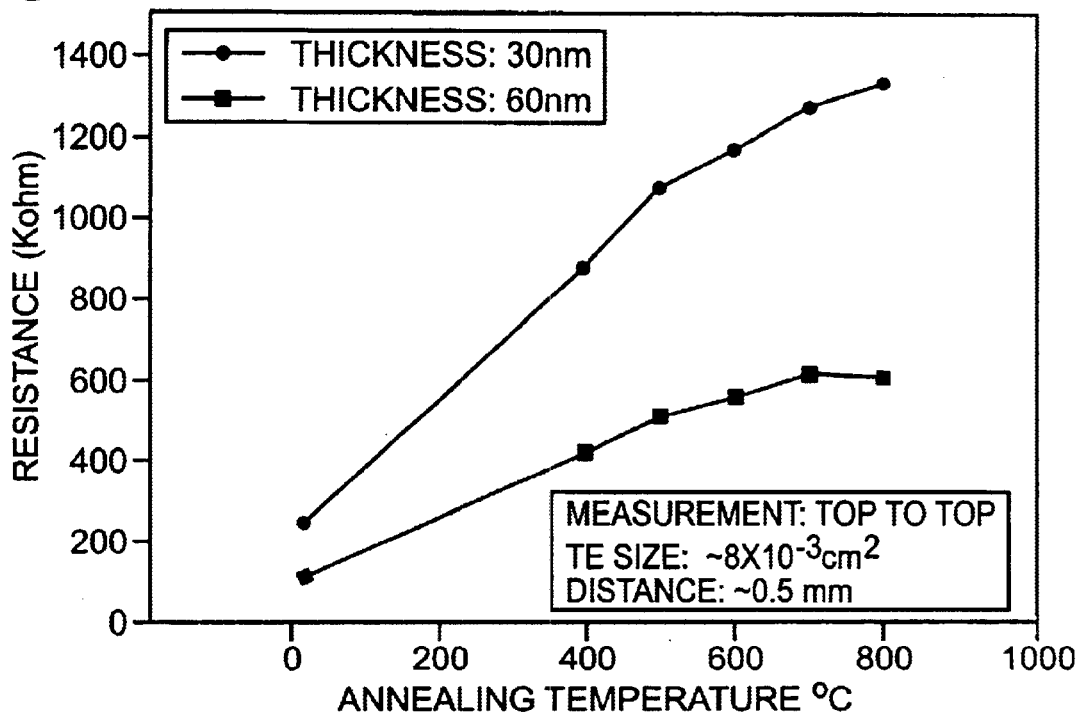
FIG. 15 is a figure showing the relationship between annealing temperature and resistivity, when $In_2O_3$ film is formed overlying a Si substrate.

FIG. 15 is a figure showing the relationship between annealing temperature and resistivity, when $In_2O_3$ film is formed overlying a Si substrate.

Based on above experimental results, it is observed that the electrical properties of In and $In_2O_3$ thin films can be controlled using PVD and post-annealing process conditions such as oxygen partial pressure, sputtering power, the thickness of the InO thin films, post-annealing temperature, and other ambient conditions.

Figure 16:
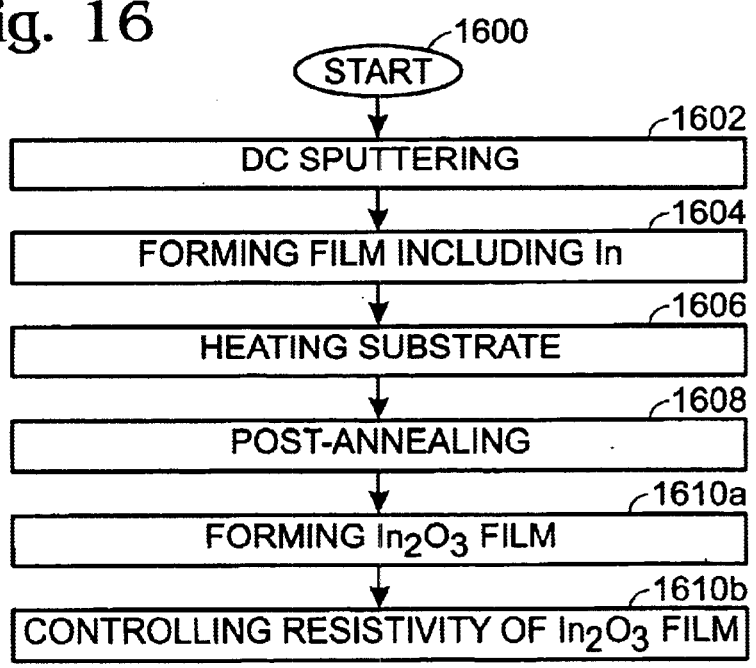
FIG. 16 is a flowchart illustrating the present invention method for controlling resistivity in an $In_2O_3$.

FIG. 16 is a flowchart illustrating the present invention method for controlling resistivity in an $In_2O_3$. Although the method is depicted as a sequence of numbered steps for clarity, no order should be inferred from the numbering unless explicitly stated. It should be understood that some of these steps may be skipped, performed in parallel, or performed without the requirement of maintaining a strict order of sequence. The method starts at Step 1600.

Step 1602 deposits an In film using a PVD process. Typically, Step 1602 includes DC sputtering with a power in the range of 200 to 300 watts. Step 1604 forms a film including In overlying a substrate material. Step 1606 simultaneously (with Step 1604) heats the substrate material. Typically, the substrate is heated to a temperature in the range of 20 to 200 degrees C. Step 1608 post-anneals, following the formation of the In-including film. As is understood in the art, a post-annealing is understood to a step separate from the other above-mentioned steps, and may be carried out at a different time and/or in a different process chamber. Typically, Step 1608 is performed in an $O_2$ atmosphere. Step 1610 has substeps responsive to the post-annealing in Step 1608. Step 1610a forms an $In_2O_3$ film. Step 1610b controls the resistivity in the $In_2O_3$ film. For example, the $In_2O_3$ film can have resistivity in the range of 260 to 800 ohm-cm.

In one aspect of the method, Step 1604 forms an In film in a 0% oxygen partial pressure environment, having a thickness in the range of 5 to 50 nm. Then, post-annealing in an $O_2$ atmosphere (Step 1608) includes annealing at a temperature in the range between 500 and 800 degrees C., for a time duration in the range between 5 to 60 minutes.

In a different aspect, Step 1604 forms an InOx film in an oxygen partial pressure environment in the range between 0.01 and 60%, having a thickness in the range of 10 to 100 nm. Then, Step 1608 anneals at a temperature in the range of 400 to 800 degrees C., for a time duration in the range between 5 and 60 minutes.

In one aspect, forming a film including In overlying a substrate material in Step 1604 includes forming a film having a sheet resistance that decreases in response to increased sputtering power. For example, the film may have a sheet resistance in the range of 200 to 2000 ohms/sq. Note, these sheet resistance values change as a result of post-annealing.

In one aspect, Step 1604 forms a film having larger crystal grains in response to increased substrate temperatures (Step 1606). For example, a film can be formed having crystal grains with a size in the range of 3 to 30 nm. In some aspects, forming a film including In overlying a substrate material (Step 1604) includes forming a film overlying a substrate material such as Pt, Ir, other noble metals, Si, high-k oxides, or $SiO_2$.

Figure 17:
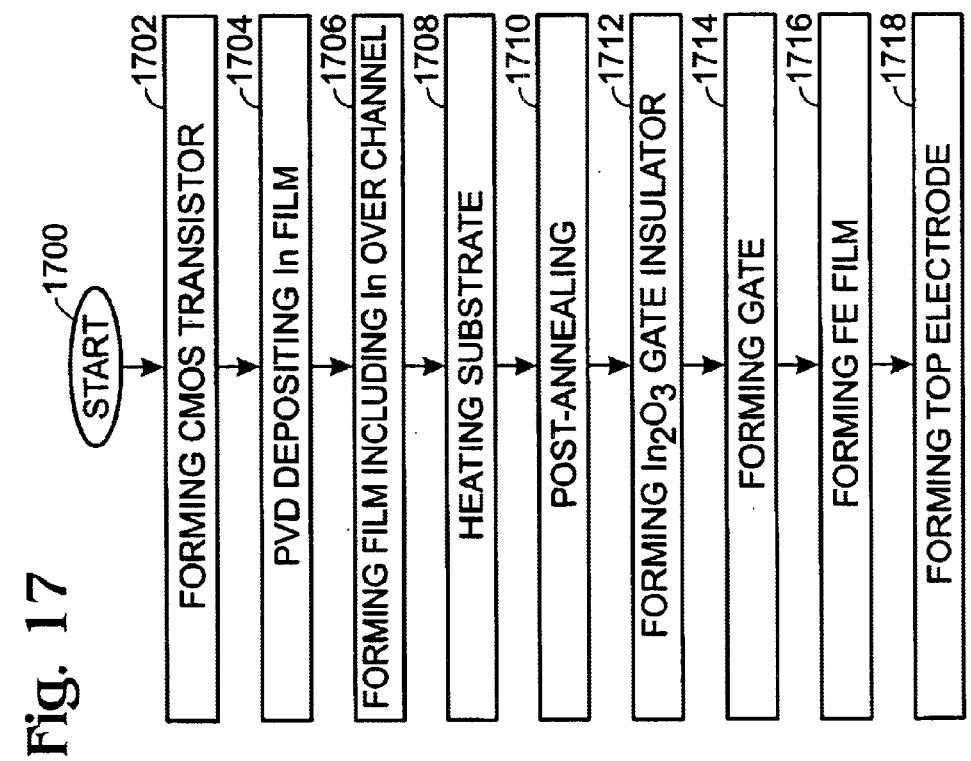
FIG. 17 is a flowchart illustrating the present invention method for forming a 1T memory device using an $In_2O_3$ film as a gate insulator replacement material.

FIG. 17 is a flowchart illustrating the present invention method for forming a 1T memory device using an $In_2O_3$ film as a gate insulator replacement material. The method starts at Step 1700. Step 1702 forms a CMOS transistor including source, drain, and channel regions in a substrate. Step 1704 deposits an In film, using a PVD process. Step 1706 forms a film including In overlying the transistor channel region. Step 1708 simultaneously (with Step 1706) heats the substrate. Step 1710 post-anneals in an $O_2$ atmosphere. Step 1712, in response to the post-annealing, forms an $In_2O_3$ film gate insulator having a resistivity in the range of 260 to 800 ohm-cm. Step 1714 forms a gate overlying the $In_2O_3$ gate insulator. Step 1716 forms a ferroelectric film overlying the $In_2O_3$. The ferroelectric is typically a material such as PGO, PZT, STO, SBT, SBTN, PLT, PLZT, or BTO. Step 1718 forms a top electrode overlying the ferroelectric film.

In some aspect a further step (not shown), Step 1703 deposits a material, interposed between the channel region and the $In_2O_3$ film. This material is typically Pt, Ir, other noble metals, high-k oxides, or $SiO_2$. However, other materials are also possible.

When Step 1714 forms a gate channel length of 0.1 micron, then Step 1712 forms an $In_2O_3$ gate insulator having a resistivity of 700 ohm-cm. When Step 1714 forms a gate channel length of 100 microns, Step 1712 forms an $In_2O_3$ gate insulator having a resistivity of 300 ohm-cm. When Step 1714 forms a gate channel length in the range of 1 to 10 microns, Step 1712 forms an $In_2O_3$ gate insulator having a resistivity in the range of 400 to 300 ohm-cm.

Figure 18:
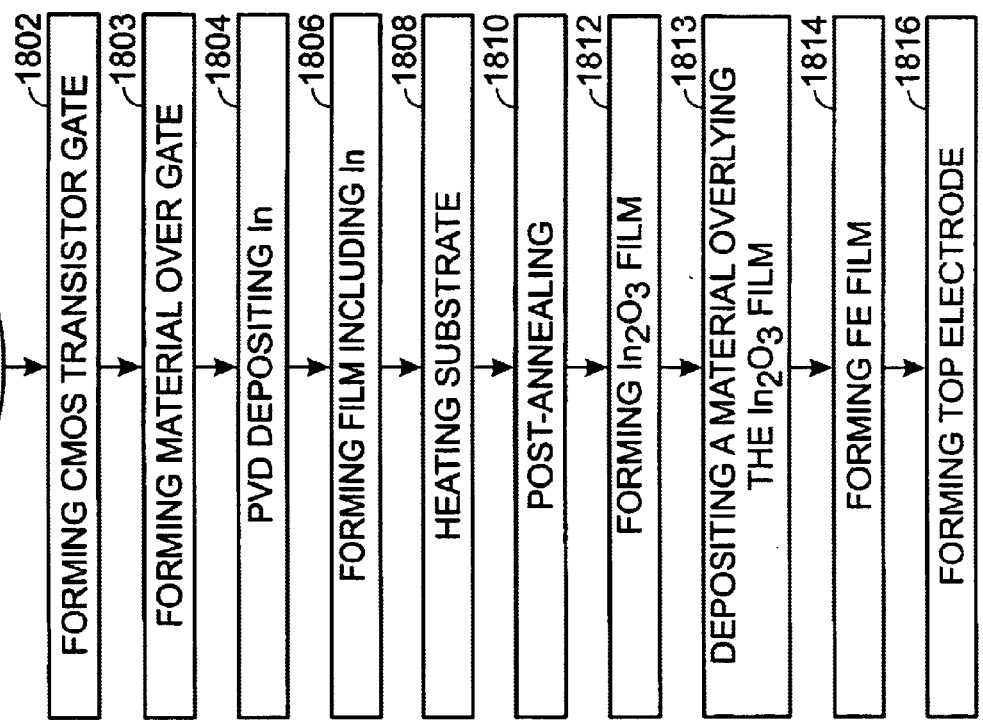
FIG. 18 is a flowchart illustrating the present invention method for forming a 1T memory device using an $In_2O_3$ film as an insulator.

FIG. 18 is a flowchart illustrating the present invention method for forming a 1T memory device using an $In_2O_3$ film as an insulator. The method starts at Step 1800. Step 1802 forms a CMOS transistor gate region in a substrate. Step 1804 deposits an In film, using a PVD process. Step 1806 forms a film including In overlying the gate region. Step 1808 simultaneously (with Step 1806) heats the substrate material. Step 1810 post-anneals in an $O_2$ atmosphere, following the formation of the In-including film. Step 1812, in response to the post-annealing, forms an $In_2O_3$ film overlying the gate having a resistivity in the range of 260 to 800 ohm-cm. Step 1814 forms a ferroelectric film overlying the $In_2O_3$ selected from the group including PGO, PZT, STO, SBT, SBTN, PLT, PLZT, and BTO. Step 1816 forms a top electrode overlying the ferroelectric film.

In some aspects, Step 1813 deposits a material, interposed between the ferroelectric memory cell film and the $In_2O_3$ film, selected from the group including Pt, Ir, other noble metals, Si, high-k oxides, and $SiO_2$.

When Step 1802 forms a gate channel length of 0.1 micron, Step 1812 forms an $In_2O_3$ film having a resistivity of 700 ohm-cm. When Step 1802 forms a gate channel length of 100 microns, Step 1812 forms an $In_2O_3$ film having a resistivity of 300 ohm-cm. When Step 1802 forms a gate channel length in the range of 1 to 10 microns, Step 1812 forms an $In_2O_3$ film having a resistivity in the range of 400 to 300 ohm-cm.

1T memory devices using an $In_2O_3$ film as a gate insulator, an $In_2O_3$ film structure, and corresponding fabrication processes have been described. Various substrates materials have been used to illustrate the invention, but the invention is not necessarily limited to the use of these materials. Likewise, specific resistivity values have been cited for particular channel lengths, but the invention is not limited to these values. Other variations and embodiments of the invention will occur to those skilled in the art.

We claim:

1. A method for controlling resistivity in an indium oxide ($In_2O_3$) film, the method comprising:

depositing an In film using a physical vapor deposition (PVD) process;

forming a film including In overlying a substrate material;

simultaneously heating the substrate material;

following the formation of the In-including film, post-annealing; and, in response to the post-annealing:
      forming an $In_2O_3$ film; and,
      controlling the resistivity in the $In_2O_3$ film.

2. The method of claim 1 wherein post-annealing includes annealing in an O2 atmosphere.

3. The method of claim 2 wherein forming a film including In overlying a substrate material includes forming an In film in a 0% oxygen partial pressure environment.

4. The method of claim 3 wherein forming an In film in a 0% oxygen partial pressure environment includes forming a film having a thickness in the range of 5 to 50 nanometers (nm); and, wherein post-annealing in an O2 atmosphere includes annealing at a temperature in the range between 500 and 800 degrees C., for a time duration in the range between 5 to 60 minutes.

5. The method of claim 2 wherein forming a film including In overlying a substrate material includes forming an InOx film in an oxygen partial pressure environment in the range between 0.01 and 60%.

6. The method of claim 5 wherein forming an InOx film includes forming an InOx film having a thickness in the range of 10 to 100 nm; and, wherein post-annealing in an O2 atmosphere includes annealing at a temperature in the range of 400 to 800 degrees C., for a time duration in the range between 5 and 60 minutes.

7. The method of claim 2 wherein depositing an In film using a PVD process includes DC sputtering with a power in the range of 200 to 300 watts.

8. The method of claim 7 wherein forming a film including In overlying a substrate material includes forming a film having a sheet resistance that decreases in response to increased sputtering power.

9. The method of claim 2 wherein forming a film including in overlying a substrate material includes forming a film having a sheet resistance in the range of 200 to 2000 ohms/sq.

10. The method of claim 2 wherein simultaneously heating the substrate material includes heating the substrate to a temperature in the range of 20 to 200 degrees C.

11. The method of claim 10 wherein forming a film including In overlying a substrate material includes forming a film having larger crystal grains in response to increased substrate temperatures.

12. The method of claim 11 wherein forming a film having larger crystal grains in response to increased substrate temperatures includes forming a film having crystal grains with a size in the range of 3 to 30 nm.

13. The method of claim 2 wherein forming a film including In overlying a substrate material includes forming a film overlying a substrate material selected from the group including platinum (Pt), iridium (Ir), other noble metals, silicon (Si), high-k oxides, and silicon dioxide ($SiO_2$).

14. The method of claim 2 wherein controlling the $In_2O_3$ resistivity in response to the post-annealing includes forming a $In_2O_3$ film having resistivity in the range of 260 to 800 ohm-cm.

15. A method for forming a one-transistor (1T) memory device using an indium oxide ($In_2O_3$) film as a gate insulator replacement material, the method comprising:

forming a CMOS transistor including source, drain, and channel regions in a substrate;

depositing an In film, using a physical vapor deposition (PVD) process;

forming a film including In overlying the transistor channel region;

simultaneously heating the substrate;

following the formation of the In-including film, post-annealing in an O2 atmosphere;

in response to the post-annealing, forming an $In_2O_3$ film gate insulator having a resistivity in the range of 260 to 800 ohm-cm;

forming a gate overlying the $In_2O_3$ gate insulator;

forming a ferroelectric film overlying the $In_2O_3$ selected from the group including PGO, PZT, STO, SBT, SBTN, PLT, PLZT, and BTO; and, forming a top electrode overlying the ferroelectric film.

16. The method of claim 15 further comprising:

depositing a material, interposed between the channel region and the $In_2O_3$ film, selected from the group including platinum (Pt), iridium (Ir), other noble metals, high-k oxides, and silicon dioxide ($SiO_2$).

17. The method of claim 15 wherein forming a gate overlying the $In_2O_3$ gate insulator includes forming a gate channel length of 0.1 micron; and, wherein forming an $In_2O_3$ film gate insulator having a resistivity in the range of 260 to 800 ohm-cm includes forming an $In_2O_3$ gate insulator having a resistivity of 700 ohm-cm.

18. The method of claim 15 wherein forming a gate overlying the $In_2O_3$ gate insulator includes forming a gate channel length of 100 microns; and, wherein forming an $In_2O_3$ film gate insulator having a resistivity in the range of 260 to 800 ohm-cm includes forming an $In_2O_3$ gate insulator having a resistivity of 300 ohm-cm.

19. The method of claim 15 wherein forming a gate overlying the $In_2O_3$ gate insulator includes forming a gate channel length in the range of 1 to 10 microns; and, wherein forming an $In_2O_3$ film gate insulator having a resistivity in the range of 260 to 800 ohm-cm includes forming an $In_2O_3$ gate insulator having a resistivity in the range of 400 to 300 ohm-cm.

20. A method for forming a one-transistor (1T) memory device using an indium oxide ($In_2O_3$) film as an insulator, the method comprising:

forming a CMOS transistor gate region in a substrate;

depositing an In film, using a physical vapor deposition (PVD) processing;

forming a film including In overlying the gate region;

simultaneously heating the substrate material;

following the formation of the In-including film, post-annealing in an O2 atmosphere;

in response to the post-annealing, forming an $In_2O_3$ film overlying the gate having a resistivity in the range of 260 to 800 ohm-cm;

forming a ferroelectric film overlying the $In_2O_3$ selected from the group including PGO, PZT, STO, SBT, SBTN, PLT, PLZT, and BTO; and, forming a top electrode overlying the ferroelectric film.

21. The method of claim 20 further comprising:

depositing a material, interposed between the ferroelectric film and the $In_2O_3$ film, selected from the group including platinum (Pt), iridium (Ir), other noble metals, silicon (Si) high-k oxides, and silicon dioxide ($SiO_2$).

22. The method of claim 20 wherein forming a gate includes forming a gate channel length of 0.1 micron; and, wherein forming an $In_2O_3$ film overlying the gate having a resistivity in the range of 260 to 800 ohm-cm includes forming an $In_2O_3$ film having a resistivity of 700 ohm-cm.

23. The method of claim 20 wherein forming a gate includes forming a gate channel length of 100 microns; and, wherein forming an $In_2O_3$ film overlying the gate having a resistivity in the range of 260 to 800 ohm-cm includes forming an $In_2O_3$ film having a resistivity of 300 ohm-cm.

24. The method of claim 20 wherein forming a gate includes forming a gate channel length in the range of 1 to 10 microns; and, wherein forming an $In_2O_3$ film overlying the gate having a resistivity in the range of 260 to 800 ohm-cm includes forming an $In_2O_3$ film having a resistivity in the range of 400 to 300 ohm-cm.

* * * * *